(12) United States Patent
Managaki

(10) Patent No.: US 11,211,580 B2
(45) Date of Patent: Dec. 28, 2021

(54) DISPLAY DEVICE AND METHOD FOR MANUFACTURING THE SAME

(71) Applicant: Japan Display Inc., Tokyo (JP)

(72) Inventor: Nobuto Managaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 15 days.

(21) Appl. No.: 16/778,072

(22) Filed: Jan. 31, 2020

(65) Prior Publication Data
US 2020/0168851 A1 May 28, 2020

Related U.S. Application Data

(63) Continuation of application No. PCT/JP2018/021242, filed on Jun. 1, 2018.

(30) Foreign Application Priority Data

Aug. 3, 2017 (JP) .............................. JP2017-150623

(51) Int. Cl.
*H01L 51/52* (2006.01)
*H01L 27/32* (2006.01)
(Continued)

(52) U.S. Cl.
CPC ........ *H01L 51/5246* (2013.01); *G06F 3/0445* (2019.05); *G06F 3/0446* (2019.05);
(Continued)

(58) Field of Classification Search
CPC ............. H01L 51/5246; H01L 51/5012; H01L 51/5253; H01L 51/56; H01L 27/326;
(Continued)

(56) References Cited

U.S. PATENT DOCUMENTS

2011/0141717 A1* 6/2011 Yoshinaga .......... H01L 51/5253
362/97.1
2014/0264300 A1 9/2014 Kamiya
(Continued)

FOREIGN PATENT DOCUMENTS

JP 2014-179278 A 9/2014

OTHER PUBLICATIONS

International Search Report dated Aug. 21, 2018 for PCT application No. PCT/JP2018/021242, with English machine translation.
(Continued)

*Primary Examiner* — Galina G Yushina
(74) *Attorney, Agent, or Firm* — Michael Best & Friedrich LLP

(57) ABSTRACT

A display device includes an organic insulating layer, a first inorganic insulating layer, and a second inorganic insulating layer arranged in a first region and a second region, a plurality of pixels arranged in the first region, a protective film arranged in the second region and in contact with an upper surface of the second inorganic insulating layer in the second region, and a groove portion is provided in the organic insulating layer in the second region. A side surface and a bottom surface of the groove portion is covered by the first inorganic insulating layer and the second inorganic insulating layer. The protective film is overlapped with an upper surface of the organic insulating layer and an upper end portion and a part of the side surface of the groove portion.

14 Claims, 15 Drawing Sheets

(51) Int. Cl.
  *H01L 51/50* (2006.01)
  *H01L 51/56* (2006.01)
  *G06F 3/044* (2006.01)

(52) U.S. Cl.
  CPC ........ *H01L 27/326* (2013.01); *H01L 51/5012* (2013.01); *H01L 51/5253* (2013.01); *H01L 51/56* (2013.01); *H01L 2251/303* (2013.01); *H01L 2251/558* (2013.01)

(58) Field of Classification Search
  CPC ............... H01L 27/323; H01L 27/3244; H01L 2251/303; H01L 2225/558; G06F 2/0445; G06F 3/0446; G09F 9/30; H05B 33/04; H05B 33/10; H05B 33/22
  See application file for complete search history.

(56) References Cited

U.S. PATENT DOCUMENTS

| | | | | |
|---|---|---|---|---|
| 2015/0287959 | A1* | 10/2015 | Hanamura | H01L 51/0096 257/40 |
| 2016/0254331 | A1* | 9/2016 | Wang | H01L 27/3246 257/40 |
| 2017/0117502 | A1* | 4/2017 | Park | H01L 51/56 |
| 2017/0345881 | A1* | 11/2017 | Kim | H01L 27/3248 |

OTHER PUBLICATIONS

Written Opinion of the International Searching Authority dated Aug. 21, 2018 for PCT application No. PCT/JP2018-021242.

\* cited by examiner

DISPLAY DEVICE AND METHOD FOR MANUFACTURING THE SAME

CROSS REFERENCE TO RELATED APPLICATIONS

This application is based upon and claims the benefit of priority from the prior Japanese Patent Application 2017-150623, filed on Aug. 3, 2017, and the prior International Application PCT/JP2018/021242, filed on Jun. 1, 2018 and the entire contents of which are incorporated herein by reference.

FIELD

An embodiment according to the present invention relates to a display device and a method for manufacturing the same.

BACKGROUND

As a display device used for electric equipment and electronic equipment, a display device including a liquid crystal display element using electrooptic effects of liquid crystal or a display device including an organic electroluminescent (organic EL) element as a display element has been developed and commercialized. Also, a touch panel, which is a display device in which a touch sensor is mounted on the display element, has been rapidly spread in recent years. The touch panel is becoming indispensable in portable information terminal such as smartphone. The touch panel has been developed worldwide for further advances in the information society.

When an organic EL element is used as a display element, it is known that the image of high image quality is displayed, but the organic EL layer is deteriorated by moisture. When the display element is driven using the deteriorated an organic EL layer, there is a possibility that a decrease of the luminance or display failure occurs. Therefore, a sealing layer is provided so as to prevent the moisture from leaking into the organic EL layer. Japanese Laid-Open Patent Publication No. 2014-179278 discloses a structure of a display device having a sealing layer.

SUMMARY

An embodiment of the present invention provides a display device including an organic insulating layer, a first inorganic insulating layer, and a second inorganic insulating layer arranged in a first region and a second region, a plurality of pixels arranged in the first region, a protective film arranged in the second region and in contact with an upper surface of the second inorganic insulating layer in the second region, and a groove portion is provided in the organic insulating layer in the second region. A side surface and a bottom surface of the groove portion is covered by the first inorganic insulating layer and the second inorganic insulating layer. The protective film is overlapped with an upper surface of the organic insulating layer and an upper end portion and a part of the side surface of the groove portion. A ratio between a height of the groove portion and a width of the bottom surface of the groove portion is 2 or more and 5 or less.

Another embodiment of the present invention provides a method of manufacturing a display device. The method includes forming an organic insulating layer so as to have a groove portion outside a display area, forming a first inorganic insulating layer so as to cover an upper surface of the organic insulating layer, a side surface and a bottom surface of the groove portion, forming a second inorganic insulating layer on the first inorganic insulating layer and forming a protective film on the second inorganic insulating layer so as to overlap with the upper surface of the organic insulating layer, a upper end portion and a part of the side surface of the groove portion. A ratio between a height of the groove portion and a width of the bottom surface of the groove portion is 2 or more and 5 or less.

DESCRIPTION OF EMBODIMENTS

Figure 1:
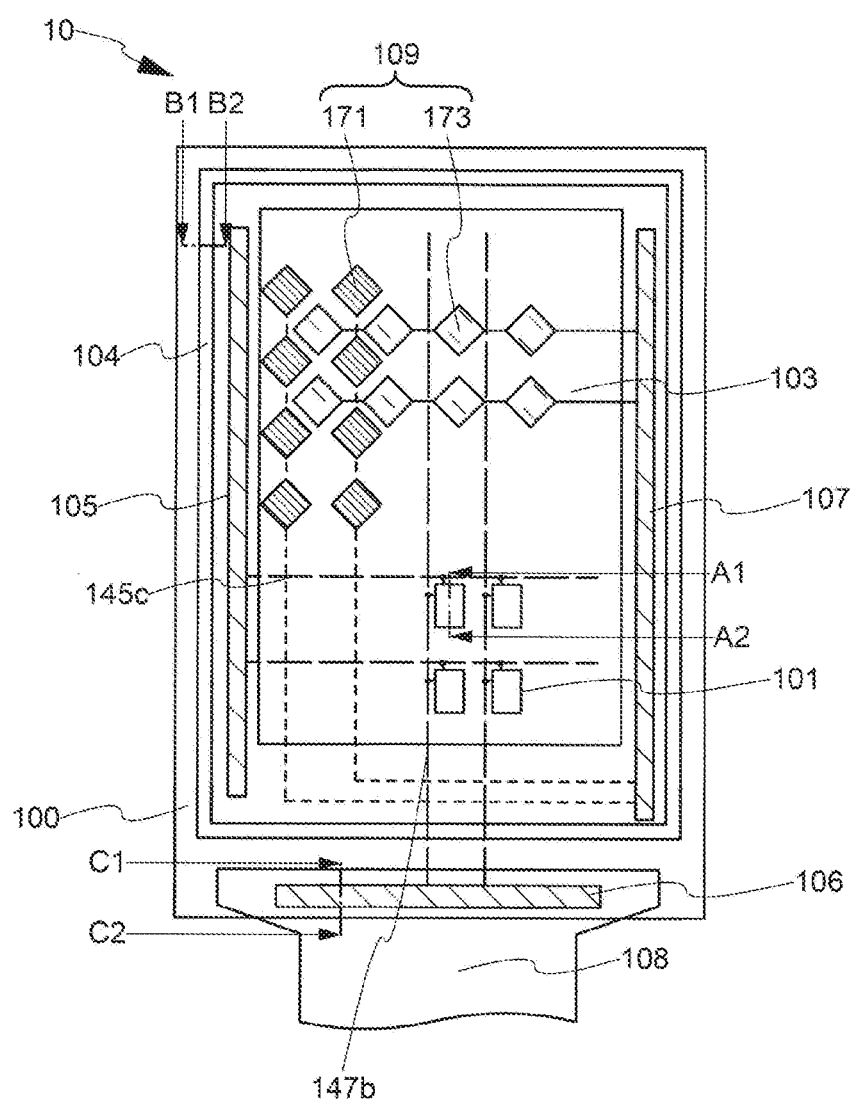
FIG. 1 is a top view showing a display device in an embodiment according to the present invention.

Hereinafter, an embodiment according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way.

In the specification and the drawings, components that have substantially the same functions as those described before with reference to a previous drawing(s) bear the identical reference signs thereto, and detailed descriptions thereof may be omitted. The words "first", "second" or the like provided for components are used merely to distinguish the components from each other, and do not have any further meaning unless otherwise specified.

Further, in the specification of the present invention, when defining the positional relationship between one component and another component, the term "above" and "below" include not only the case of positioning directly above or below a certain component, but also a case where further another component is provided therebetween unless otherwise specified.

Further, the terms "conductive layer", "electrodes" and "wiring" herein have similar meanings and can be interchanged depending on the circumstances.

An embodiment according to the present invention provides a highly reliable display device while protecting the sealing layers.

FIG. 1 shows a top view of a display device 10 in an embodiment according to the present invention.

(1-1. Configuration of Display Device)

In FIG. 1, a display device 10 includes a display region 103, a peripheral portion 104, a driving circuit 105, a driving circuit 106, a driving circuit 107, a flexible printing substrate 108, and a touch sensor 109 provided on the substrate 100. The driving circuit 105 has a function as a gate driver. The driving circuit 106 has a function as a source driver. The driving circuit 107 has the function of controlling the touch sensor. In the display region 103, a plurality of pixels 101 are arranged spaced apart in a grid shape. The pixel 101 serves as a component of the images. A scan wiring 145c is connected to the driving circuit 105. A signal wiring 147b is connected to the driving circuit 106. Pixel 101 is connected to scan wiring 145c and signal wiring 147b. The touch sensor 109 has a first sensor electrode 171 and a second sensor electrode 173. The first sensor electrode 171 and the second sensor electrode 173 are connected to the driving circuit 107.

In the display device 10, video signals are input to the driving circuit 106 through the flexible print substrate 108. Then, the driving circuit 105 and the driving circuit 106 drive the display element 130 in the pixel 101 through the scan wiring 145c and the signal wiring 147b. As a result, a still image and a moving image are displayed in the display region 103. Incidentally, the display region 103 may be referred to as a first region.

Further, in the touch sensor 109, the first sensor electrode 171 functions as a transmitting electrode. The second sensor electrode 173 functions as a receiving electrode. In the touch sensor 109, the capacity between the first sensor electrode 171 and the second sensor electrode 173 varies when a person brings his or her finger closer to the touch sensor 109. The touch sensor 109 detects the position information by utilizing this capacitive change.

(1-2. Configuration of the Peripheral Portion)

The peripheral portion 104 is arranged outside the display region 103. The peripheral portion 104 (between the B1-B2 of FIG. 1) is described with reference to FIG. 2.

Figure 2:
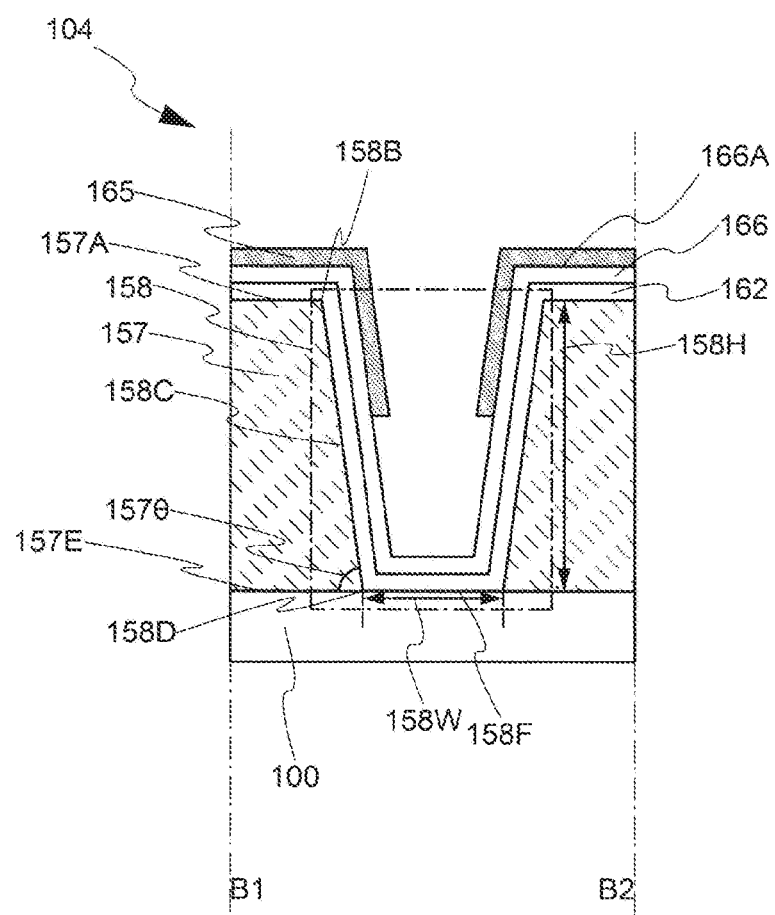
FIG. 2 is a cross-sectional view showing a peripheral portion in an embodiment according to the present invention.

FIG. 2 is a cross-sectional view of the peripheral portion 104. The peripheral portion 104 includes substrate 100, a rib 157, an inorganic insulating layer 162, an inorganic insulating layer 166 and a protective film 165. Incidentally, the peripheral portion 104 may be referred to as a second region. The rib 157, the inorganic insulating layer 162, and the inorganic insulating layer 166 are arranged on the display region 103. The rib 157, the inorganic insulating layer 162, and the inorganic insulating layer 166 are extended from the display region 103 to the peripheral portion 104.

Figure 3:
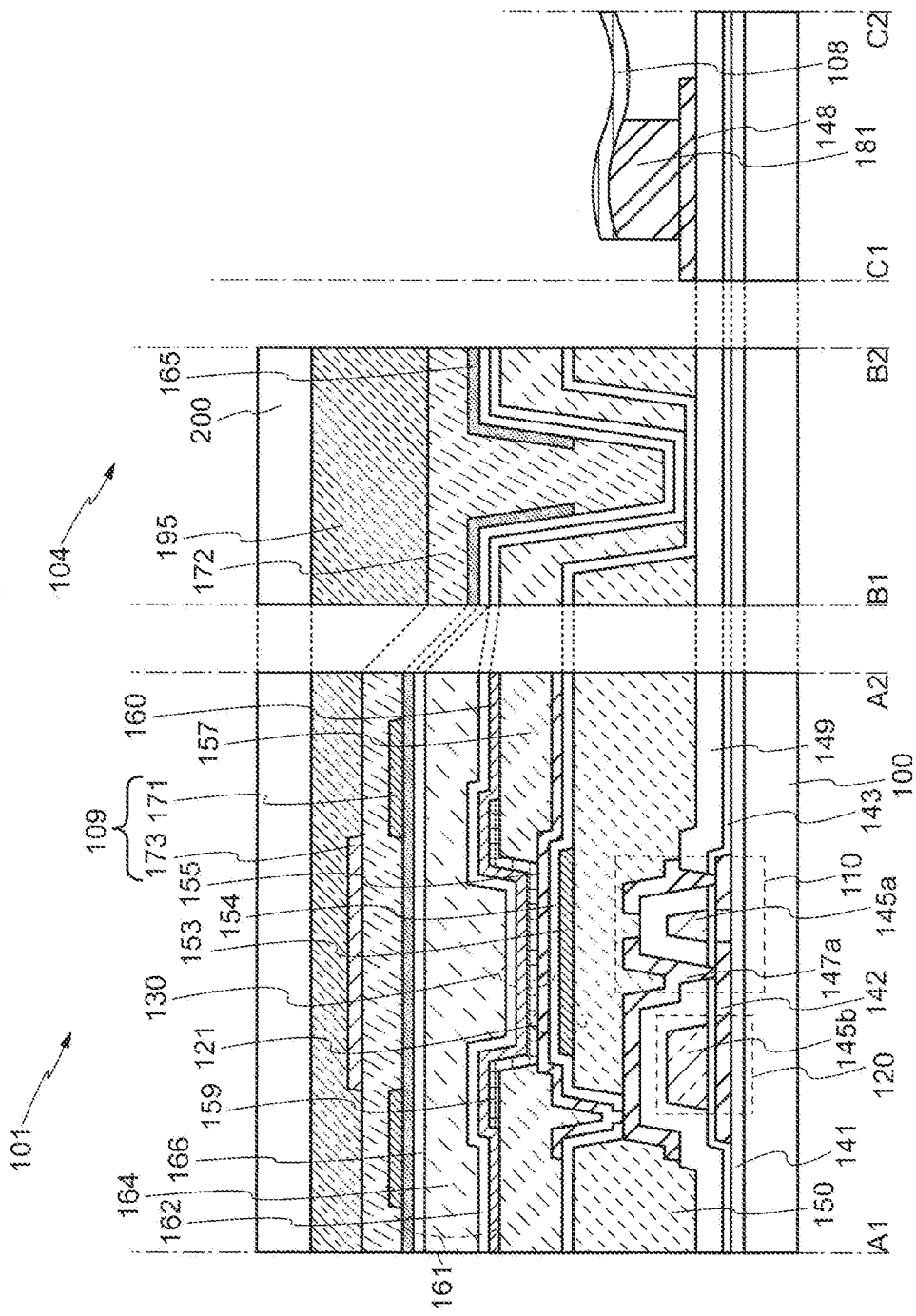
FIG. 3 is a cross-sectional view showing the display device in an embodiment according to the present invention.

The substrate 100 is formed of a glass substrate or an organic resin substrate. For example, the substrate 100 is formed of a polyimide resin. Incidentally, in this case, the substrate 100 may not be single. For example, the substrate 100 may be combined with an insulating layer 141, a gate insulating layer 143, an insulating layer 149 and a planarization layer 150 as shown in FIG. 3.

The rib 157 (sometimes referred to as organic insulating layer, a bank layer or a barrier) are provided on substrate 100. The rib 157 is formed of an organic insulating material (organic resin material). In other words, the rib 157 can be organic insulating layer. For example, the rib 157 is formed of a polyimide resin.

As described later, the rib 157 covers the peripheral portion of a pixel electrode 155 of the display element 130 in order to separate each pixel 101 in the display region 103. On the other hand, in the peripheral portion 104, the rib 157 have a groove portion 158. In this case, an upper surface 157A and a bottom surface 157E of the rib 157, an upper end portion 158B, a side surface 158C, a lower end portion 158D and a bottom surface 158F of the groove portion 158 are provided in the peripheral portion 104.

In addition, in the groove portion 158, a ratio of a height 158H of the groove portion 158 and a width 158W of the bottom surface 158F of the groove portion 158 (referred to as aspect ratio) is 2 or more and 5 or less, more preferably 2.5 or more and 4 or less. For example, when the aspect ratio is 3, if the width 158W of the bottom surface 158F of the groove portion 158 is 3 μm, the height 158H of the groove portion 158 is 9 μm. Alternatively, if the width 158W of the bottom surface 158F of the groove portion 158 is 10 μm, the height 158H of the groove portion 158 is 30 μm.

Further, the side surface 158C of the groove portion 158 in the rib 157 is inclined. In this case, it is desirable that the angle 157θ formed by the bottom surface 157E of the rib 157 and the side surface 158C of the groove portion 158 and (referred to as tapered angle) is 70 degrees or more and 90 degrees or less.

The inorganic insulating layer 162 and the inorganic insulating layer 166 function as part of a sealing layer (a sealing layer 161 to be described later). The inorganic insulating layer 162 is provided on the substrate 100 and the rib 157. The inorganic insulating layer 162 is positioned so as to cover the upper surface 157A of the rib 157, the side surface 158C and the bottom surface 158F of the groove portion 158. The inorganic insulating layer 166 is provided on the inorganic insulating layer 162.

The inorganic insulating layer 162 and the inorganic insulating layer 166 are formed of an inorganic insulating material such as a silicon nitride, a silicon oxide, a silicon oxide nitride. In this example, the inorganic insulating layer 162 and the inorganic insulating layer 166 are formed of a silicon nitride film. The silicon nitride film is dense, and the silicon nitride film is suitable for blocking moisture. The thickness of the inorganic insulating layer 162 is not limited, but preferably 50 nm or more and 2 μm or less.

The protective film 165 is provided in contact with an upper surface 166A of the inorganic insulating layer 166. The protective film 165 is overlapped with the upper surface 157A of the rib 157, the top end portion 158B and the side surface 158C of the groove portion 158. The protective film 165 includes an inorganic insulating material such as silicon oxide, silicon oxide nitride, silicon oxide nitride or the like, a conductive material such as tungsten, indium tin oxide (ITO), namely an inorganic material. In this example, the protective film 165 is formed of a silicon oxide film. The thickness of the protective film 165 is not limited, but it can be 50 nm or more and 200 nm or less.

(1-3. Configuration of Each Layer of the Display Device)

The details of the respective configuration of display device 10 are shown as follow. FIG. 3 is a cross-sectional view of the pixel 101 (between the A1-A2) and a terminal part (between C1-C2) including the driving circuit 106 in addition to the peripheral portion 104 (between the B1-B2).

A transistor 110 includes a semiconductor layer 142, a gate insulating layer 143, a gate electrode 145a, and a source drain electrode 147a. The transistor 110 has a top gate top contact structure, but is not limited thereto. The transistor 110 may have a bottom gate structure or a bottom contact structure.

The capacity element 120 includes the gate insulating layer 143, a source or drain region of a semiconductor layer 142 and a capacitive electrode 145b. The gate insulating layer 143 is used as a dielectric of a capacity element 121. The capacity element 121 includes an insulating layer 154, a conductive layer 153 and a pixel electrode 155. The insulating layer 154 is used as a dielectric in the capacity element 121.

The display element 130 includes the pixel electrode 155, an organic EL layer 159 and a counter electrode 160. In other words, the display elements 130 can be said to be organic EL element. The display element 130 has a so-called top emission type structure that emits light emitted by the organic EL layer 159 to the counter electrode 160 side. Incidentally, the display element 130 is not limited to the top emission type structure, but may be a bottom emission type structure.

The planarization layer 150 has a function as a planarizing film and is provided on the insulating layer 149 and the source drain electrode 147a. The planarization layer 150 includes an organic resin. In this example, the planarization layer 150 is formed of an acrylic resin, but is not limited thereto. Incidentally, the planarization layer 150 is formed of an epoxy resin, a polyimide resin, a polyamide resin, a polystyrene resin, a polyethylene resin, a polyethylene terephthalate resin or the like. In addition, the planarization layer 150 is formed of a lamination of an organic resin and an inorganic material.

The rib 157 covers the peripheral portion of the pixel electrode 155 which are part of the display elements 130 as described above. The rib 157 is formed of an organic resin material. For example, the rib 157 is formed of a polyimide resin. In addition, the rib 157 may be formed of an organic resin material containing a black pigment in order to increase the contrast ratio of the display image.

In addition, as shown in FIG. 3, the rib 157 is provided on the substrate 100, the insulating layer 141, the gate insulating layer 143, the insulating layer 149, the planarization layer 150 and the insulating layer 154 in the peripheral portion 104 (between the B1-B2). The rib 157 covers the upper surface and the side surface 158C of the planarization layer 150 along with the insulating layer 154.

The sealing layer 161 has a function of preventing contamination of moisture from the outside of the display device 10 to the display element 130. In the display region 103 including the pixel 101 (between the A1-A2), the sealing layer 161 is formed by stacking the inorganic insulating layer 162, the organic insulating layer 164 and the inorganic insulating layer 166 in this order. On the other hand, in the peripheral portion 104 (between the B1-B2), the inorganic insulating layer 162 and the inorganic insulating layer 166 are stacked. In addition, the inorganic insulating layer 162 contacts the insulating layer 154 including an inorganic material to be described later. Thus, the multilayer stacked structure using the inorganic insulating layer may be referred to as a moisture blocking structure.

The organic insulating layer 164 can cover foreign matter that enters during manufacturing. The thickness of the organic insulating layer 164 is not limited, but preferably 5 μm or more and 20 μm or less. The organic insulating layer 164 is formed of the material similar to the planarization layer 150.

The touch sensor 109 includes the first sensor electrode 171, an insulating layer 172, and the second sensor electrode 173. The first sensor electrode 171 and the second sensor electrode 173 are formed of a material having a translucent property. Specifically, the first sensor electrode 171 and the second sensor electrode 173 are formed of indium tin oxide (ITO) etc., but not limited thereto. Further, the first sensor electrode 171 and the second sensor electrode 173 are made of TAT (Ti/Al/Ti).

The substrate 100 and a substrate 200 are formed of a glass substrate or an organic resin substrate. For example, the substrate 100 and a substrate 200 are formed of a polyimide substrate. the substrate 100 and a substrate 200 can make the plate thickness from several micrometer to several tens of micrometer, and it becomes possible to realize a sheet display having flexibility. The substrate 100 and the substrate 200 require the transparency in order to take out the emitted light from the light emitting device to be described later. If the substrate on the side that does not take out the emitted light from the light emitting element does not have to be transparent. Thus, in addition to the aforementioned materials, the substrate 100 and the substrate 200 may be formed of a material including an insulating layer formed on the surface of the metallic substrate. Incidentally, a cover glass, a protective film or the like may be provided on the second surface of the substrate 100 and the substrate 200 (when viewing the cross section, outer surface of the substrate). Thus, the display device can be prevented from scratching and scratching. The substrate 200 has a role of protecting the light emitting element to be described later, but it is not necessary as long as it can be sufficiently protected by the sealing layer.

The insulating layer 141 is provided on the substrate 100. The insulating layer 141 has a function as an underlying film. Thus, it is possible to suppress the diffusion of impurities such as alkaline metals, water, hydrogen from the substrate 100 into the semiconductor layer 142.

The semiconductor layer 142 is provided on the insulating layer 141. The semiconductor layer 142 may be silicon, oxide semiconductor or organic semiconductor or the like.

The gate insulating layer 143 is provided on the insulating layer 141 and the semiconductor layer 142. The gate insulating layer 143 is formed of an inorganic material such as a silicon oxide, a silicon oxynitride, a silicon nitride or other high dielectric.

The gate electrode 145a is provided on the gate insulating layer 143. The gate electrode 145a is appropriately connected to the scan wiring 145c. Incidentally, the gate electrode 145a and the capacitive electrode 145b is also provided on the gate insulating layer 143. The gate electrode 145a and the capacitive electrode 145b are both formed of a conductive material selected from tantalum, tungsten, titanium, molybdenum, aluminum, or the like. The gate electrode 145a and the capacitive electrode 145b may be a single layer structure of the conductive material described above, alternatively may be a stacking structure.

The insulating layer 149 is formed of a material similar to the gate insulating layer 143. The insulating layer 149 is provided on the gate insulating layer 143, the gate electrode 145a and the capacitive electrode 145b. Incidentally, the insulating layer 149 may be a single layer, alternatively may be a laminated structure of the above material.

The source drain electrode 147a is provided on the insulating layer 149. The source drain electrode 147a is appropriately connected to the signal wiring 147b. The source drain electrode 147a is formed of a material similar to that listed as a material example of the gate electrode 145a. The source drain electrode 147a may be formed of the same material as the gate electrode 145a, alternatively may be formed of a different material. In addition to the source-drain electrode 147a, since the other wiring is also formed using the similar conductive layer, so that the source-drain electrode 147a and the other wiring require a low resistance, good bonding between the semiconductor layer 142.

The conductive layer 153 is provided on the planarization layer 150. The conductive layer 153 may be formed of the same material as the gate electrode 145a or different materials. In addition to the conductive layer 153, other wiring, which is not specifically shown in figures, but bonded to the source-drain electrodes 147a described above is also formed using this conductive layer. Therefore, the conductive layer 153 is required to have a low resistance, good bondability with the conductive material constituting the source-drain electrode 147a, and the like.

The insulating layer 154 is provided on the planarization layer 150 and the conductive layer 153. The insulating layer 154 is formed of a material similar to the gate insulating layer 143.

The pixel electrode 155 has a function as an anode of the display element 130. Further, the pixel electrode 155 preferably have the property of reflecting light. The material preferred as the former function is an oxide conductive material such as indium tin oxide (ITO) or indium zinc oxide (IZO). The material preferred as the latter function is a highly surface reflective conductive material such as aluminum or silver. To achieve both these functions, the lamination of the material described above, specifically, the structure where an oxide conductive layer such as indium tin oxide (ITO) or indium zinc oxide (IZO) is stacked on the surface reflective high conductive layer such as aluminum or silver is used in the pixel electrode 155.

The organic EL layer 159 is provided on the pixel electrode 155. The organic EL layer 159 has a light emitting material such as an organic electroluminescent material.

The counter electrode 160 has the function of a cathode of the display element 130. The counter electrode 160 is provided so as to continuously cover the pixel electrode 155 across a plurality of pixel electrodes 155. To transmit the light emitted by the organic EL layer 159 to the counter electrode 160, the counter electrode is formed of a material having a light transmitting property and conductivity.

The counter electrode 160 is required to have translucency. At the same time, the counter electrode 160 requires the reflectivity so that the microcavity is formed between the reflective surface of the pixel electrode 155 and the counter electrode 160. Therefore, the counter electrode 160 is formed as a semi-permeable film. Specifically, in the counter electrode 160, a layer including silver, magnesium, or a layer made of alloys thereof are formed at a thickness to the extent that the light transmits.

An adhesive layer 195 is formed of an inorganic material, an organic material, or a composite material of organic and inorganic material. For example, the adhesive layer 195 is formed of an acrylic resin.

(1-4. Display Device Manufacturing Methods)

Hereinafter, the manufacturing method of the display device 10 will be described with reference to FIGS. 4 to 11.

(1-4-1. Formation of Transistor)

Figure 4:
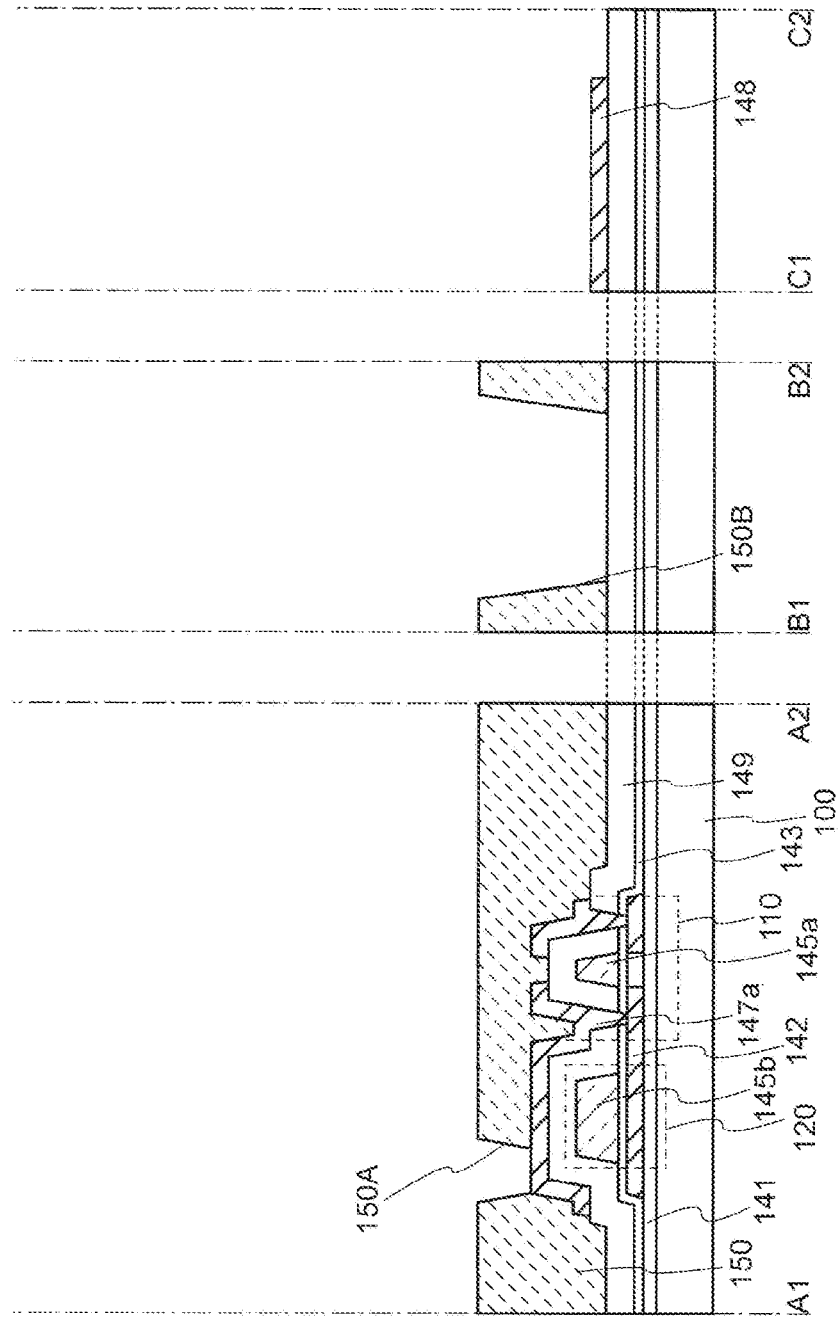
FIG. 4 is a cross-sectional view illustrating a method of manufacturing the display device in an embodiment according to the present invention.

First, the insulating layer 141, the semiconductor layer 142 and the gate insulating layer 143 is formed on the first surface of the substrate 100 as shown in FIG. 4 (upper surface when viewed from the cross-sectional direction). Thereafter, the gate electrode 145a is formed on the gate insulating layer 143. Each layer described above is processed into a predetermined shape using a photolithography method, a nanoimprinting method, an inkjet method or an etching method, and the like appropriately.

For example, when the substrate 100 is formed of an organic resin substrate the substrate 100 is formed of polyimide substrate.

The insulating layer 141 is formed of a material such as silicon oxide, silicon oxynitride, silicon nitride or the like. The insulating layer 141 may be a single layer or a stacking layer. The insulating layer 141 is formed by a CVD method, a spin-coating method or a printing method, or the like.

When the semiconductor layer 142 is formed of a silicon material as, for example, the semiconductor layer 142 is formed of amorphous silicon, polycrystalline silicon or the like. Further, when the semiconductor layer 142 is formed of oxide semiconductor, for example, the semiconductor layer 142 is formed of oxide including indium, gallium, zinc, titanium, aluminum, tin, a metal material such as cerium is used. For example, the semiconductor layer 142 may be formed of oxide semiconductors (IGZO) having indium, gallium, and zinc. The semiconductor layer 142 is formed by a sputtering method, a vapor deposition method, a plating method or the CVD method or the like.

The gate insulating layer 143 is formed of an insulating layer containing one or more kinds of silicon oxide, silicon oxynitride, silicon nitride, silicon nitride oxide, aluminum oxide, magnesium oxide, hafnium oxide, or the like. The gate insulating layer 143 can be formed by the same method as the insulating layer 141.

The gate electrode 145a is formed using a metal element selected from tungsten, aluminum, chromium, copper, titanium, tantalum, molybdenum, nickel, iron, cobalt, tungsten, indium, zinc, or an alloy composed of the metal element or an alloy combining the metal elements described above. Further, the gate electrode 145a may be formed of the metal elements described above containing nitrogen in the material, oxygen, those hydrogen or the like is contained. For example, the gate electrode 145a is formed of a stacking layer including aluminum (Al) and titanium (Ti) by sputtering method.

Next, the insulating layer 149 is formed on the gate insulating layer 143, the gate electrode 145a and the capacitive electrode 145b. The insulating layer 149 is formed using a material and a method similar to the gate insulating layer 143. For example, the insulating layer 149 is formed of a silicon oxide film by a plasma-CVD method.

Next, the source drain electrode 147a is formed on the insulating layer 149. The source drain electrode 147a may be formed of a material and a method similar to gate electrode 145a. The source-drain electrode 147a is formed after forming an opening in the insulating layer 149. The source drain electrode 147a is connected to the source drain region of the semiconductor layer 142. The conductive layer 148 is formed simultaneously with the source and drain electrode 147a.

Next, as shown in FIG. 4, the planarization layer 150 is formed on the insulating layer 149 and the source drain electrode 147a. The planarization layer 150 is formed of an organic insulating material such as acrylic resin, epoxy resin, polyimide resin. The planarization layer 150 can be formed by a spin-coating method, a printing method, an inkjet method, or the like. For example, the planarization layer 150 may be formed of an acrylic resin by the spin-coating method. The planarization layer 150 is formed to the extent that the upper surface is flat. In the planarization layer 150, an opening 150A which electrically connect the pixel electrode 155 and the transistor 110 is formed in a portion of the pixel 101 (between the A1-A2). Further, in the planarization layer 150, the groove portion 150B is formed on the peripheral portion 104 (between the B1-B2). Also, the planarization layer 150 of the terminal part (between the C1-C2) may be removed.

(1-4-2. Formation of Display Element)

Next, the capacity element 121 (formed of the conductive layer 153, the insulating layer 154 and the pixel electrode 155), the display element 130 (formed of the pixel electrode 155, the organic EL layer 159 and the counter electrode 160), and the rib 157 are formed on the planarization layer 150. Each layer is processed into a predetermined shape using the photolithography method, the nanoimprinting method, the inkjet method or the etching method, and the like appropriately.

First, the conductive layer 153 is formed on the planarization layer 150. The conductive layer 153 may be formed of a material and a method similar to the gate electrode 145a. For example, the conductive layer 153 is formed of the laminating film of molybdenum, aluminum, and molybdenum formed by the sputtering method.

Next, the insulating layer 154 is formed on the conductive layer 153. The insulating layer 154 is formed by a material and a method similar to the gate insulating layer 143. For example, the insulating layer 154 is formed of a silicon nitride film formed by the plasma CVD method. Incidentally, the insulating layer 154 is removed from the terminal part (between the C1-C2), may not be processed in another portion.

Next, in the pixel 101 (between the A1-A2), the pixel electrodes 155 are formed on the insulating layer 154. For example, the pixel electrode 155 may be formed of a light-reflective metallic material such as aluminum (Al) and silver (Ag). Alternatively, the pixel electrode 155 may be formed by a structure in which a transparent conductive layer by indium tin oxide (ITO) or indium zinc oxide (IZO) having excellent hole implantability and a photo-reflective metal layer is laminated. The pixel electrode 155 is formed by the same manner as the gate electrode 145a. For example, the pixel electrodes 155 is formed of a laminated film of ITO, silver and ITO formed by the sputtering method.

Figure 5:
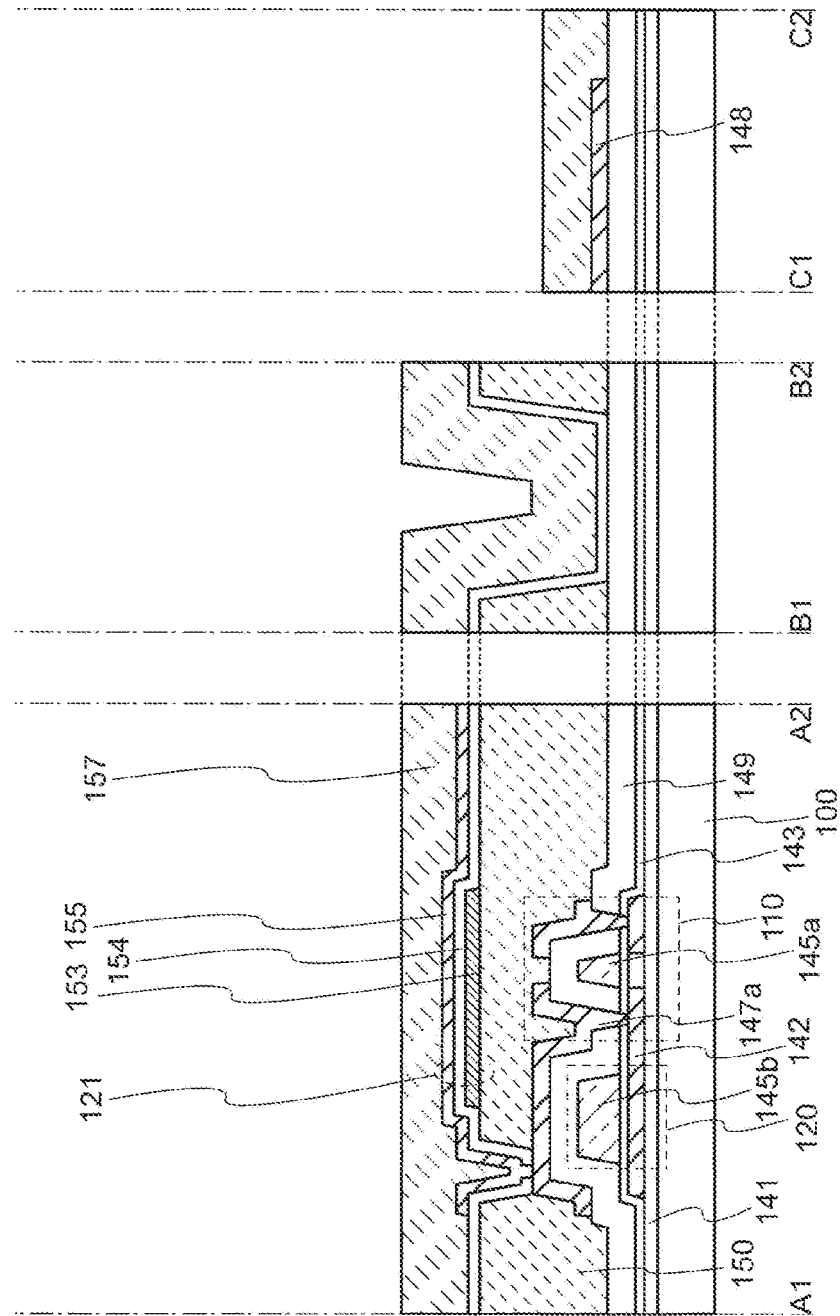
FIG. 5 is a cross-sectional view illustrating the method for manufacturing the display device in an embodiment according to the present invention.

Next, as shown in FIG. 5, the rib 157 is formed on the insulating layer 154 and the pixel electrode 155. For example, the rib 157 is formed of polyimide film formed by the spin-coating method.

Figure 6:
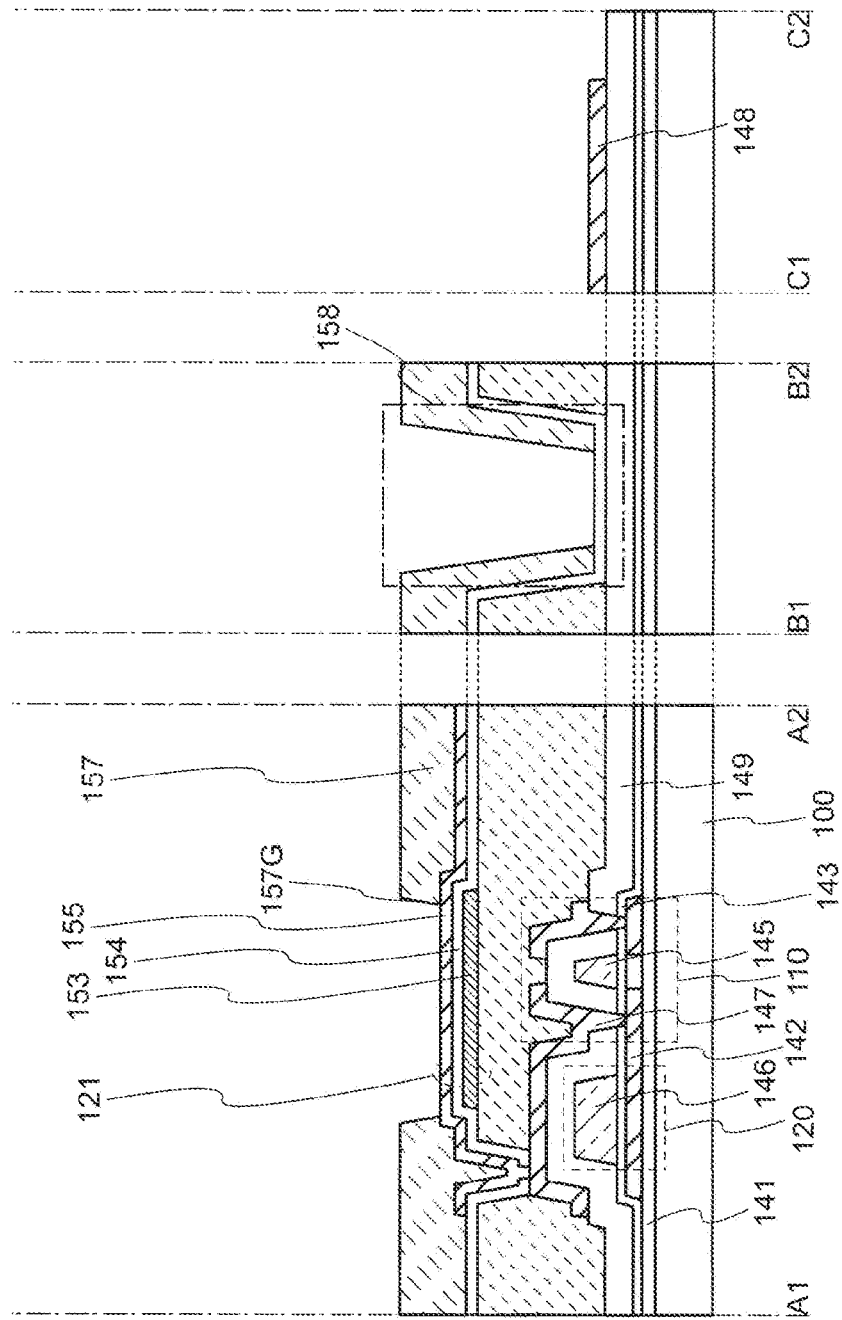
FIG. 6 is a cross-sectional view illustrating the method for manufacturing the display device in an embodiment according to the present invention.

Next, as shown in FIG. 6, in the rib 157, an opening 157G is formed so as to expose the upper surface of the pixel electrodes 155. Further, in the peripheral portion 104 (between the B1-B2), the groove portion 158 is formed so that the moisture blocking structure described above is formed on the rib 157. In this case, the ratio between the height of the groove portion 158 and the width of the bottom surface 158F of the groove portion 158 is 2 or more and 5 or less, preferably 2.5 or more and 4 or less. Further, the side surface 158C of the groove portion 158 among the rib 157 in the peripheral portion 104 (between the B1-B2) is preferably inclined at an angle of 70 degrees or more and 90 degrees or less. Incidentally, the rib 157 of the terminal part (between the C1-C2) is removed.

Next, in the pixel 101 (between the A1-A2), the organic EL layer 159 is formed on the pixel electrode 155 and the rib 157. The organic EL layer 159 is formed using an organic material of a low molecule or a polymer. When using an organic material of the low molecule, the organic EL layer 159 may be configured to include the hole injection layer and the electron injection layer arranged so as to sandwich the light emitting layer, further hole transport layer and the electron transport layer or the like in addition to the light emitting layer comprising a light emitting organic material.

Further, the organic EL layer 159 is formed so as to be overlapped with at least the pixel electrode 155. The organic EL layer 159 may be formed by a vacuum deposition method, printing method, spin-coating method, and the like. When forming the organic EL layer 159 by the vacuum deposition method, the organic EL layer 159 may be formed while providing an area that is not deposited by using a shadow mask appropriately. The organic EL layer 159 may be formed using a material that differ from neighboring pixel. Alternatively, the organic EL layer 159 may be formed of the same material in all pixel.

Figure 7:
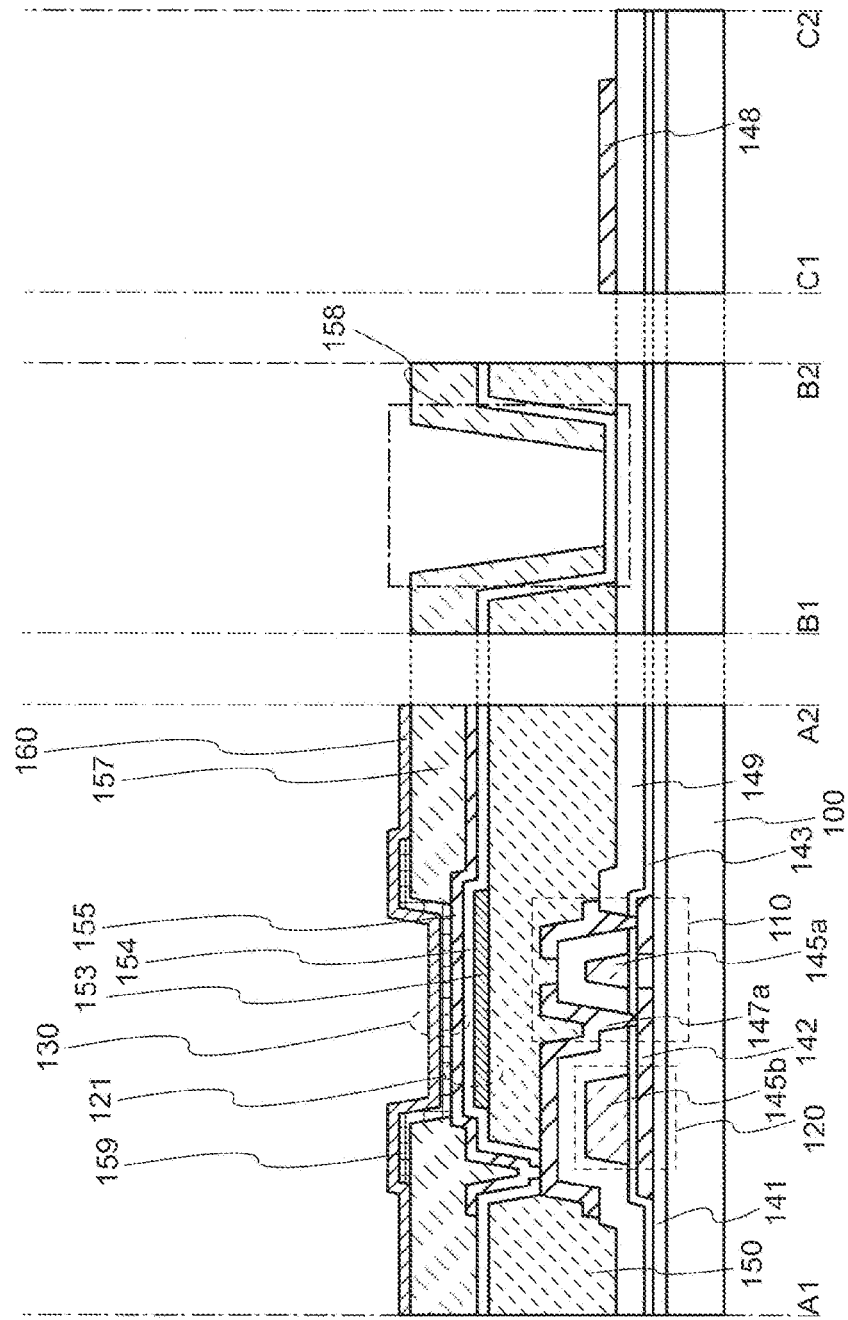
FIG. 7 is a cross-sectional view illustrating the method for manufacturing the display device in an embodiment according to the present invention.

Next, the counter electrode 160 is formed so as to straddle the pixel electrode 155 and the organic EL layer 159 in the pixel 101 (between the A1-A2) (see FIG. 7). The counter electrode may be formed of 160 a transparent conductive film such as indium tin oxide (ITO) or indium zinc oxide (IZO), or an alloy of silver (Ag) and magnesium. Further, the counter electrode 160 can be formed by the vacuum deposition method or the sputtering method. For example, the counter electrode 160 is formed of an alloy film of silver (Ag) and magnesium deposited by the vapor deposition method. Incidentally, the counter electrode 160 may be formed without being processed. In this case, the counter electrode 160 may also be formed on the peripheral portion 104 (between the B1-B2). In this case, the counter-electrode 160 is removed from the terminal part (between the C1-C2).

(1-4-3. Formation of Sealing Layer)

Figure 8:
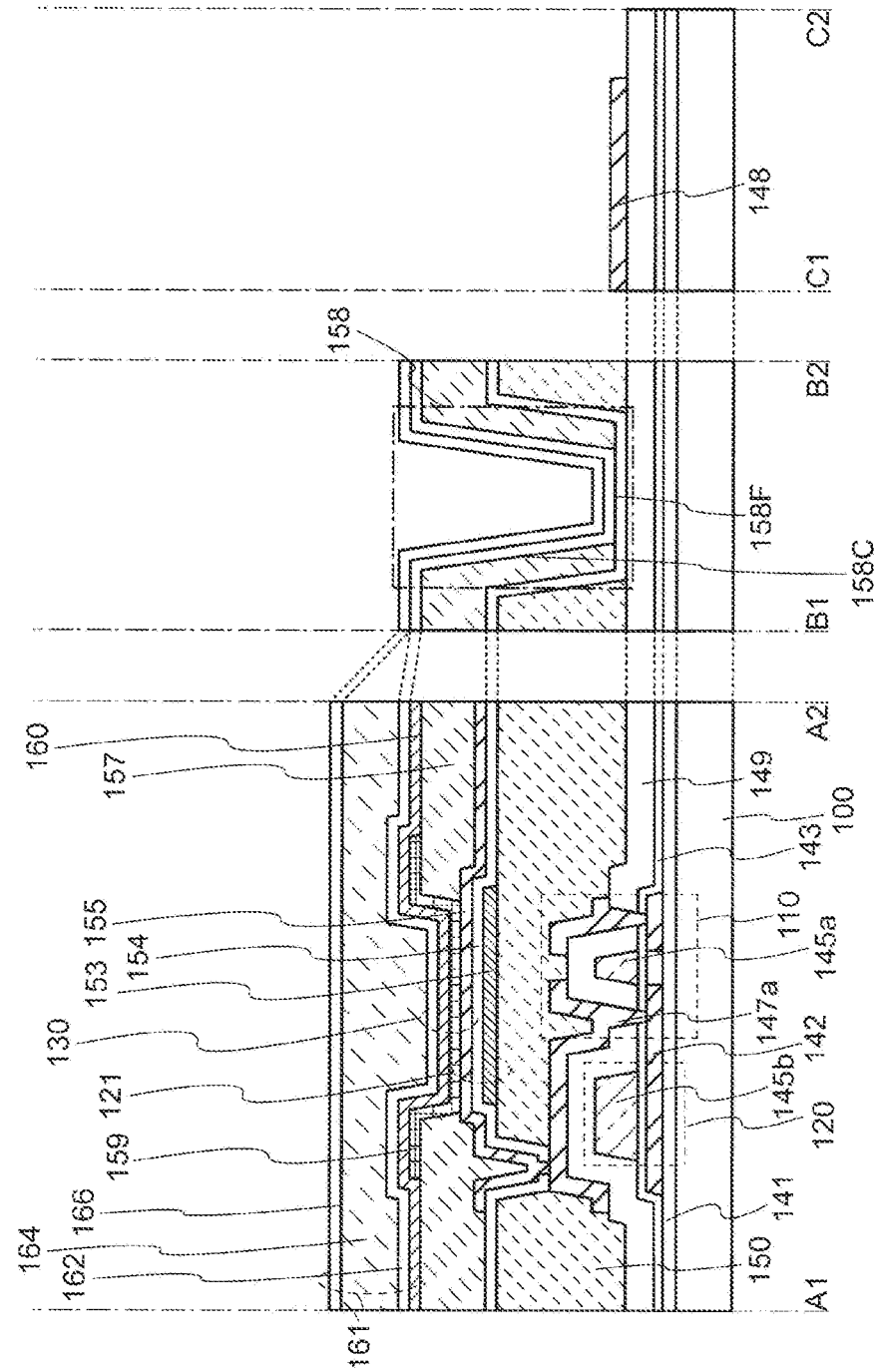
FIG. 8 is a cross-sectional view illustrating the method for manufacturing the display device in an embodiment according to the present invention.

Next, as shown in FIG. 8, in the pixel 101 (between the A1-A2), the inorganic insulating layer 162, the organic insulating layer 164 and the inorganic insulating layer 166 which serve as a sealing layer 161 are formed in order on the counter electrodes 160. In this case, in the peripheral portion 104 (between the B1-B2), the inorganic insulating layer 162 is formed so as to cover the upper surface of the rib 157, the side surface 158C and the bottom surface 158F of the groove portion 158. Further, the organic insulating layer 164 formed in the peripheral portion 104 (between the B1-B2) is removed. That is, in the peripheral portion 104 (between the B1-B2), the inorganic insulating layer 166 is formed on the inorganic insulating layer 162. The sealing layer 161 is formed so as to cover the entire surface of the display region 103. Incidentally, the sealing layer 161 in the terminal part (between the C1-C2) is removed.

The organic insulating layer 164 may be formed of a material such as an acrylic resin, a polyimide resin, an epoxy resin, and the like. The organic insulating layer 164 may be formed using the inkjet method, the spin-coating method, the vapor deposition method, a spraying method, the printing method, or the like. The thickness of the organic insulating layer 164 is not limited. For example, the thickness of the organic insulating layer 164 may be 5 μm or more and 20 μm or less.

The inorganic insulating layer 162 and the inorganic insulating layer 166 are formed of an insulating film containing one or more among aluminum oxide, silicon oxide, silicon nitride. The inorganic insulating layer 162 and the inorganic insulating layer 166 are formed using a high coverage forming method (i.e. long mean free path of film-forming particles) to cover the upper surface of the rib 157 the side surface 158C and the bottom surface 158F of the groove portion 158. For example, the inorganic insulating layer 162 and the inorganic insulating layer 166 are formed of a silicon nitride film formed by the plasma CVD method. The thickness of the inorganic insulating layer 162 and the inorganic insulating layer 166 are not limited. For example, the thickness of the inorganic insulating layer 162 and the inorganic insulating layer 166 can be 50 nm or more and 2 μm or less. Incidentally, the film formation method of the inorganic insulating layer 162 and the inorganic insulating layer 166 is not limited to the plasma CVD method. The inorganic insulating layer 162 and the inorganic insulating layer 166 may be formed by the molecular beam epitaxy (MBE) method as a long film formation method of a mean free path of the film formation particles.

Figure 9:
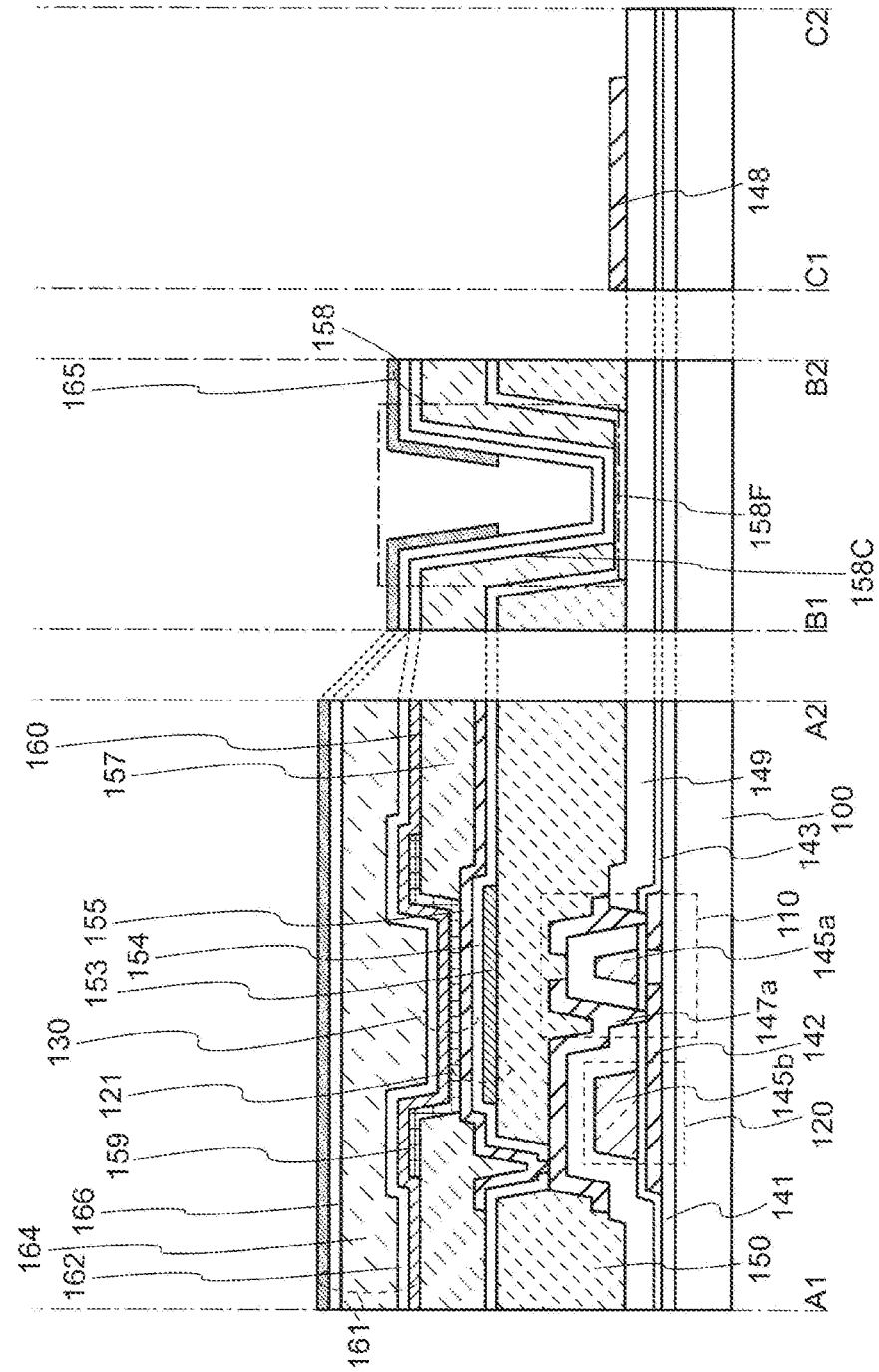
FIG. 9 is a cross-sectional view illustrating the method for manufacturing the display device in an embodiment according to the present invention.

Next, as shown in FIG. 9, the protective film 165 is uniformly formed on the inorganic insulating layer 166. The protective film 165 is formed so as to overlap with a portion of the upper surface of the rib 157, the upper end portion 158B and the side surface 158C of the groove portion 158. In this case, it is desirable that the mean free path of the particles to be deposited by the formation method of the protective film 165 (including molecules, atoms, etc.) is shorter than the mean free path of particles to be deposited by the formation method of inorganic insulating layer 162 and the inorganic insulating layer 166. In this case, the protective film 165 is formed by the sputtering method, a resistance-heated vacuum deposition method, or an electron-beam heating evaporation method. When using these manufacturing methods, it is suppressed that the protective film 165 is formed on the side surface 158C of the groove portion 158 (particularly the lower side surface of the groove portion 158). Alternatively, for example, after the protective film 165 is formed using a process having a long mean free process such as the plasma CVD method, only the side surface of the protective film 165 may be removed by ion irradiation with tilt angles in ion milling method. These methods relieve the stresses that occur in the protective film 165. The protective film 165 is preferably a high etching selective ratio (preferably two or more) material between the inorganic insulating layer 166 and the protective film 165. For example, the protective film 165 is formed of a silicon oxide film formed by the sputtering method.

(1-4-4. Forming the Touch Sensor)

Figure 10:
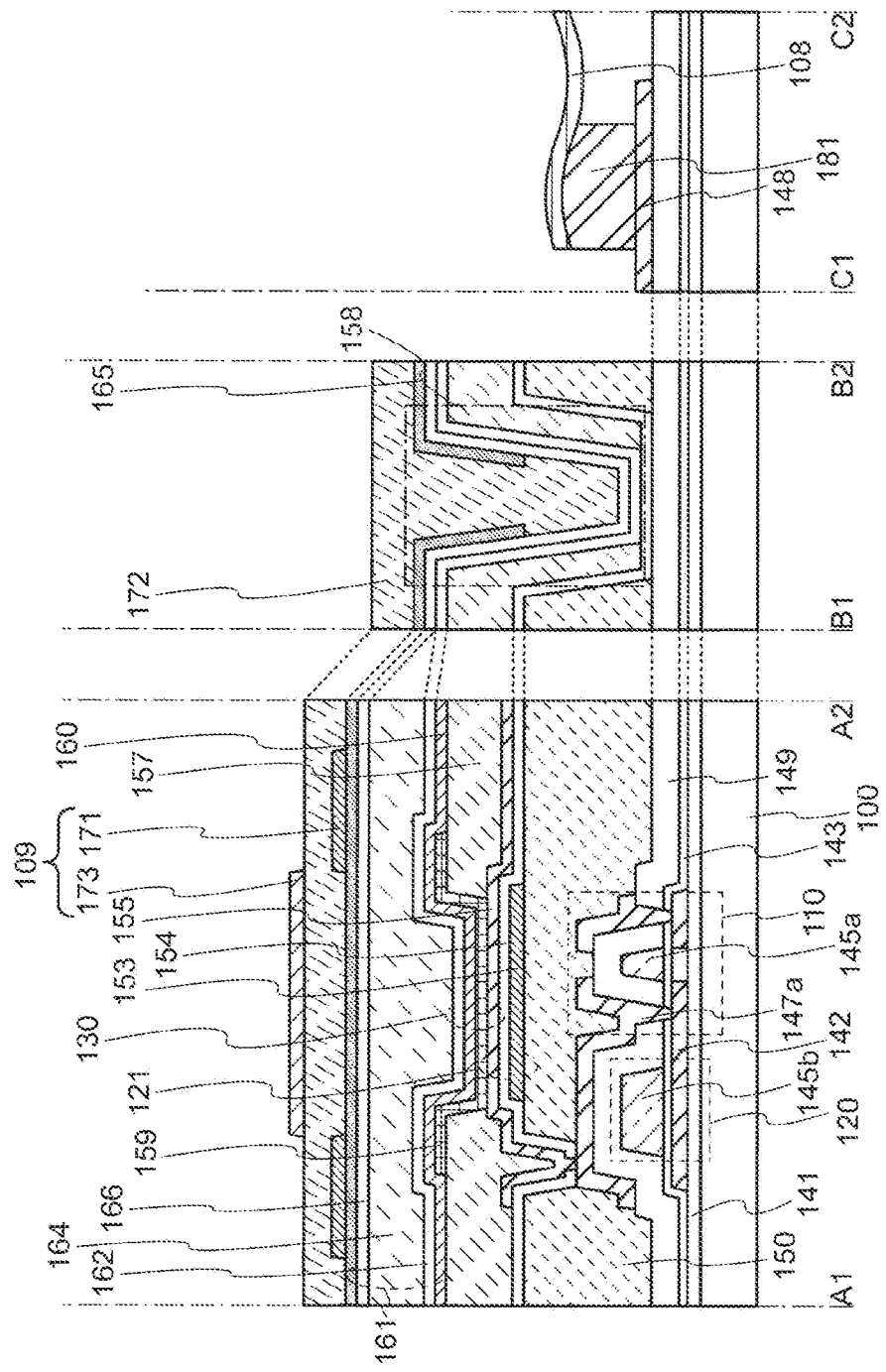
FIG. 10 is a cross-sectional view illustrating the method for manufacturing the display device in an embodiment according to the present invention.

Next, as shown in FIG. 10, the touch sensor 109 is formed. First, the first sensor electrode 171 is formed. The first sensor electrode 171 is formed by the sputtering method in this example. The first sensor electrode 171 may be formed by the vapor deposition method, the printing method, the coating method, a molecular ray evaporation method (MBE) or the like without limited to the sputtering method. The first sensor electrode 171 is processed by the photolithography method and the etching method after film formation. The first sensor electrode 171 is formed of indium zinc oxide (IZO), indium tin oxide (ITO), other zinc oxide (ZnO), indium tin oxide (ITZO), or the same materials as the gate electrode 145a are used.

Next, an insulating layer 172 is formed on the first sensor electrode 171 and the protective film 165. The insulating layer 172 is formed by the coating method. The insulating layer 172 is formed of an organic resin material such as an acrylic resin, a polyimide resin, an epoxy resin. Further, the insulating layer 172 is formed is formed to the thickness of several hundred nm or more and ten micrometer or less using the spin-coating method, the vapor deposition method, the spray method, the inkjet method, the printing method or the like.

Next, the insulating layer 172 is processed. In this case, the insulating layer 172 is processed by the photolithography method and the etching method. Incidentally, if the insulating layer 172 includes a photosensitive material, the insulating layer 172 may be formed by only the photolithography method.

Next, the second sensor electrode 173 is formed. The second sensor electrode 173 is formed of a material having a translucent property. For example, the second sensor electrode 173 is formed by the sputtering method. The second sensor electrode 173 may be formed by the vapor deposition method, printing method, or the inkjet method without limited to the sputtering method. For example, the second sensor electrode 173 is formed of indium tin oxide (ITO) formed by the sputtering method.

(1-4-5. Bonding with Opposing Substrate)

Next, the substrate 200 serving as the opposing substrate, and the substrate 100 is bonded using the adhesive layer 195. For example, the adhesive layer 195 is formed of epoxy resin, acrylic resin or the like.

Finally, the flexible printed substrate 108 is electrically connected to the conductive layer 148 using an anisotropic conductive film 181. In this case, the film which is present in the terminal part (between the C1-C2) may be removed by performing laser irradiation. Anisotropic conductive film 181 may be formed by applying a resin containing a metal particle such as silver, copper.

By the above methods, the display device 10 shown in FIG. 3 is manufactured.

(1-5. Functions of Peripheral Portion)

Figure 15:
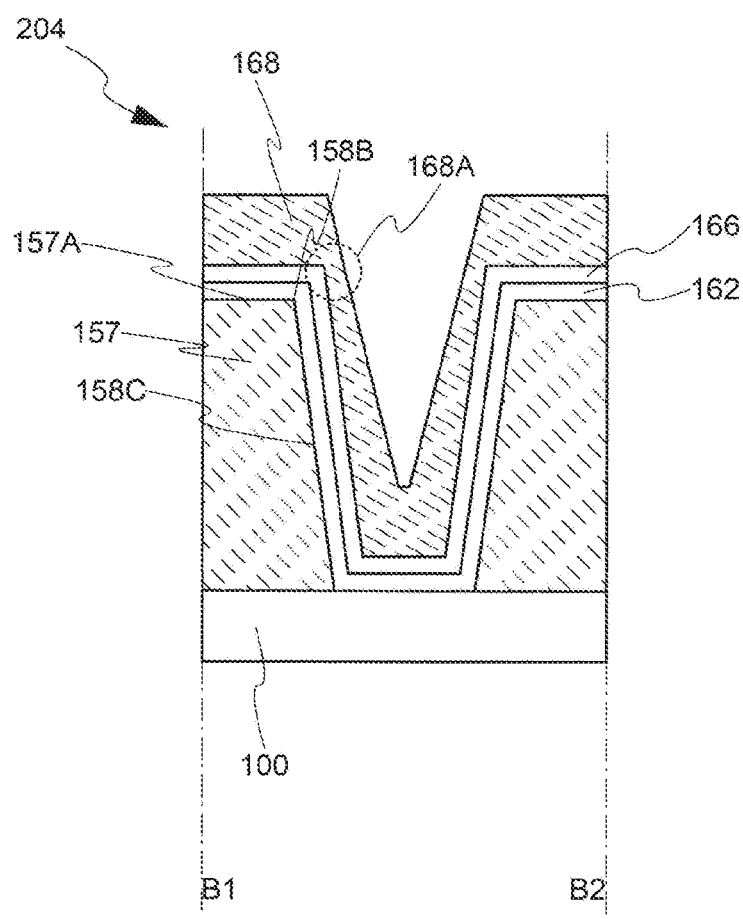
FIG. 15 is a cross-sectional view showing a conventional peripheral portion.

FIG. 15 is a cross-sectional view of a conventional peripheral portion 204 having no protective film 165 at the peripheral portion 104. In the conventional organic EL display device, a step (sometimes referred to as the rib) is provided to separate images from each other. The height difference of the step may be larger in the area outside the display region than in the display region. In the place where the height difference of the step is large, there is a case where the thickness of the resist formed on the sealing layer in the manufacturing process of the display device is reduced. Specifically, as shown in FIG. 15, when the resist 168 is provided without the peripheral portion 104 has a protective film 165, there is a case where the thickness of the portion 168A overlapped with the upper surface 157A of the rib 157, the upper end portion 158B and the side surface 158C of the groove portion 158 among the resist 168 is thinner than the thickness of the resist 168 overlapped with the upper surface 157A of the rib 157 among the resist 168. In this case, when forming the touch panel on the display region, there is a case where a wiring layer is provided on the sealing layer. When the thickness of the resist is reduced as described above, there is a case where the sealing layer is etched. As a result, the function of blocking the moisture by the sealing layer may be lowered.

Figure 11:
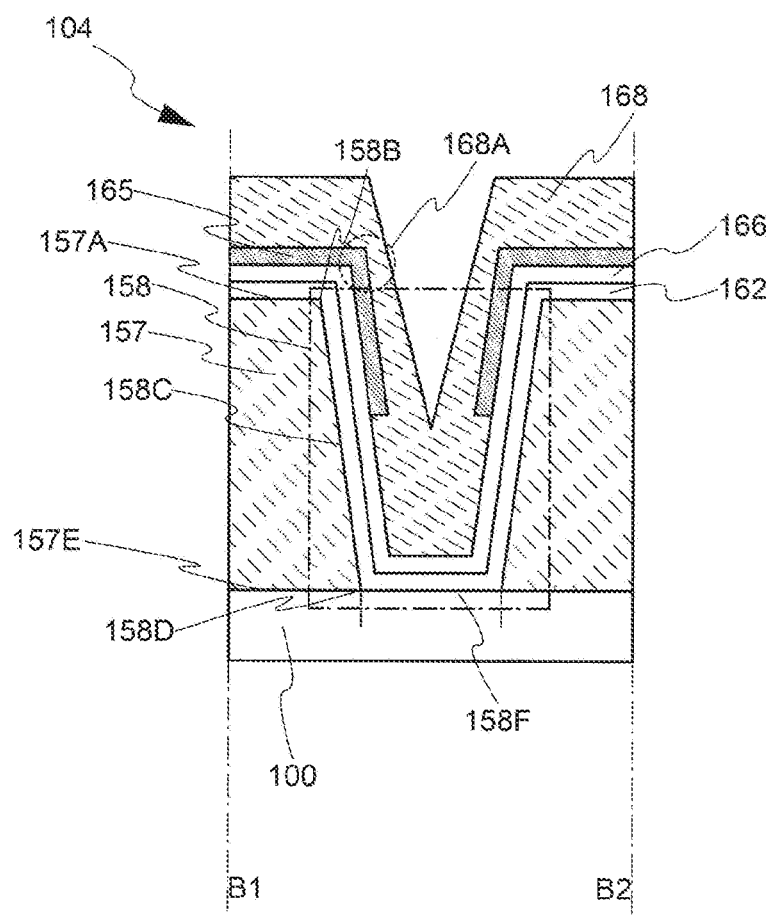
FIG. 11 is a cross-sectional view showing the peripheral portion in an embodiment according to the present invention.

FIG. 11 is a cross-sectional view of the case of forming a resist in the peripheral portion 104 shown in FIG. 2. As shown in FIG. 11, the peripheral portion 104 has a protective film 165. Thereby, it is possible to protect the inorganic insulating layer 162 and the inorganic insulating layer 166 in the manufacturing process of the display device 10 (particularly when the touch sensor is formed), even if there is a place where the thickness of the resist becomes thinner. Accordingly, the function of the sealing layer 161 is successfully exhibited, and the display device 10 can shut off moisture. In other words, the deterioration due to moisture of the organic EL layer 159 can be suppressed. As a result, it is possible to provide a reliable display device.

(Modification 1)

Figure 12:
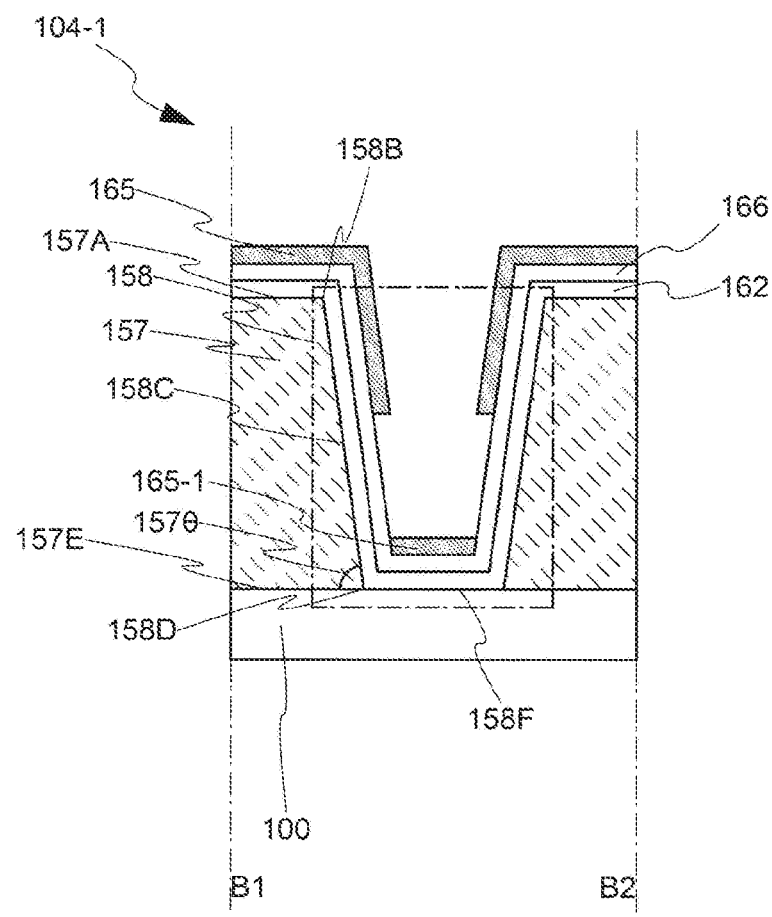
FIG. 12 is a cross-sectional view showing a modification of the peripheral portion in an embodiment according to the present invention.

An embodiment of the present invention shows an example in which the protective film 165 is not formed in the bottom surface 158F of the groove portion 158 of the rib 157, but is not limited thereto. FIG. 12 shows a cross-sectional view of the peripheral portion 104-1. As shown in FIG. 12, the protective film 165-1 may be formed on the bottom surface 158F of the groove portion 158 in the peripheral portion 104. Further, the protective film 165-1 may be dotted. In this case, it is possible to protect the inorganic insulating layer 162 and the inorganic insulating layer 166 even when the resist is not sufficiently formed on the bottom surface 158F of the groove portion 158.

(Modification 2)

Figure 13:
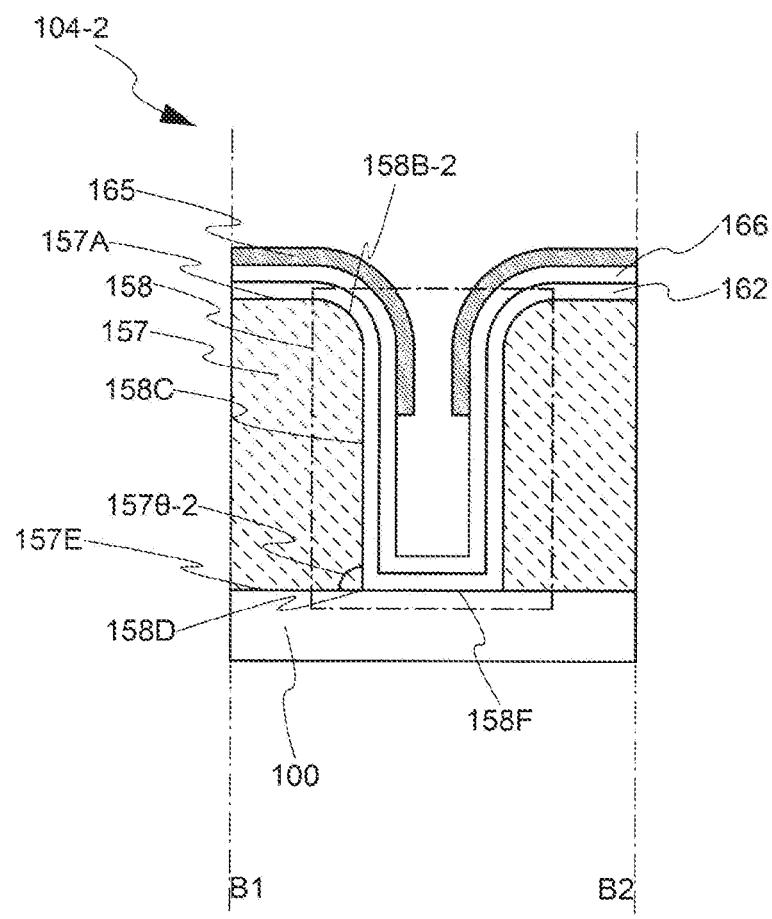
FIG. 13 is a cross-sectional view showing a modification of the peripheral portion in an embodiment according to the present invention.

An embodiment of the present invention shows the example in which the side surface 158C of the rib 157 is inclined (having a tapered shape), but is not limited thereto. FIG. 13 is a cross-sectional view of the peripheral portion 104-2. As shown in FIG. 13, the tapered angle 157θ-2 of the rib 157 may be right angle or substantially right angle. The tapered angle 157θ-2 in this case may be 85 degrees or more and 90 degrees or less. In this case, the upper end portion 158B-2 of the rib 157 may be rounded. Thus, it is easy to form a protective film 165 on the inorganic insulating layer 166 in the vicinity of the upper end portion of the rib 157. Further, in the case of this shape (between the A1-A2), it is possible to make the step in the display element 130 more smooth in the pixel 101 shown in FIG. 3. Thus, it is possible to enhance the coverage of the organic EL layer 159.

(Modification 3)

Figure 14:
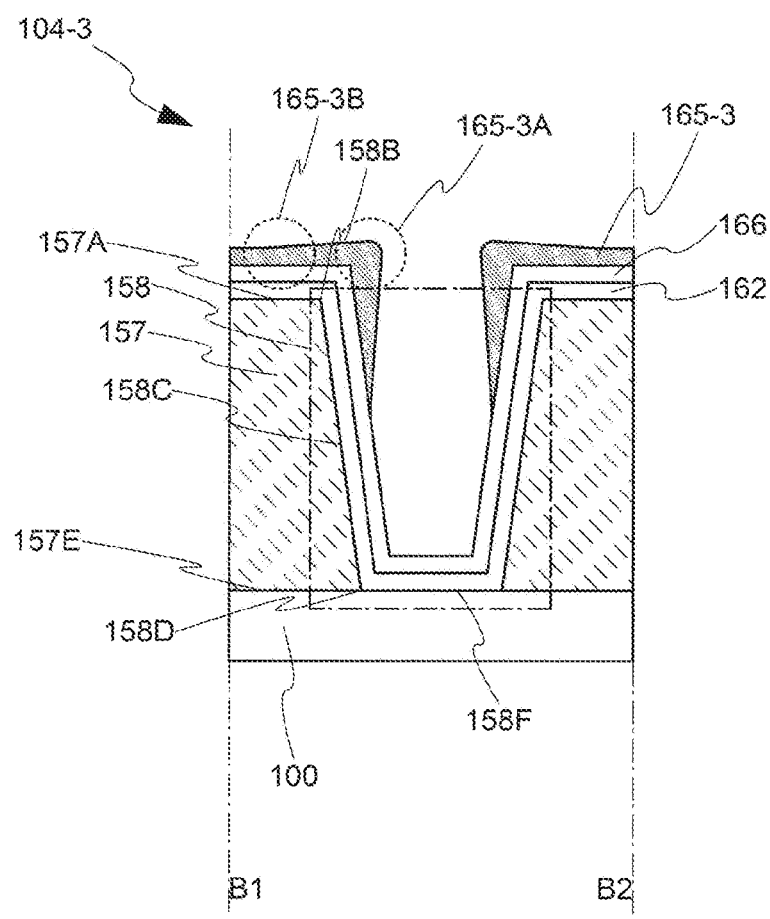
FIG. 14 is a cross-sectional view showing a modification of the peripheral portion in an embodiment according to the present invention.

An embodiment of the present invention shows examples in which the thickness of the protective film is uniform, but is not limited thereto. FIG. 14 is a cross-sectional view of the peripheral portion 104-3. As shown in FIG. 14, in the protective film 165-3, the thickness of the portion 165-3B which is overlapped with the upper end portion 158B of the rib 157 is may be thicker than the thickness of the portion 165-3A which is overlapped with the upper surface 157A. Further, the thickness may be changed downward from the portion 165-3A (the thickness is thinned in this example). With such a configuration, it is possible to further protect the inorganic insulating layer 162 and the inorganic insulating layer 166 in a portion where the thickness of the resist tends to be thin.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

What is claimed is:

1. A display device comprising;
an organic insulating layer, a first inorganic insulating layer, and a second inorganic insulating layer arranged in a first region and a second region; a plurality of pixels arranged in the first region;
a protective film arranged in the second region and in contact with an upper surface of the second inorganic insulating layer in the second region; and
a groove portion arranged in the organic insulating layer in the second region, wherein a side surface and a bottom surface of the groove portion is covered by the first inorganic insulating layer and the second inorganic insulating layer,
the protective film is overlapped with an upper surface of the organic insulating layer and an upper end portion and a portion of the side surface of the groove portion,
a ratio between a height of the groove portion and a width of the bottom surface of the groove portion is 2 or more and 5 or less, and
a thickness of a protective film portion overlapping with the upper end portion of the groove portion is larger than a thickness of a protective film portion overlapping with the upper surface of the organic insulating layer.

2. The display device according to claim 1, wherein
the side surface of the groove portion of the organic insulating layer is inclined at an angle of 70 degrees or more and 90 degrees or less to a bottom portion of the organic insulating layer.

3. The display device according to claim 2, wherein
the ratio between the height of the groove portion and the width of the bottom surface of the groove portion is 2.5 or more and 4 or less.

4. The display device according to claim 3, wherein
the first inorganic insulating layer and the second inorganic insulating layer are silicon nitride films.

5. The display device according to claim 1, wherein
the protective film includes an inorganic material.

6. The display device according to claim 5, wherein
the protective film is a silicon oxide film.

7. The display device according to claim 1, wherein
each of the plurality of pixels includes an organic EL element.

8. A method of manufacturing a display device, the method comprising:
forming an organic insulating layer having a groove portion outside a display area;
forming a first inorganic insulating layer covering an upper surface of the organic insulating layer, a side surface and a bottom surface of the groove portion;
forming a second inorganic insulating layer on the first inorganic insulating layer; and
forming a protective film on the second inorganic insulating layer overlapping with the upper surface of the organic insulating layer, an upper end portion and a part of the side surface of the groove portion, wherein
a ratio between a height of the groove portion and a width of the bottom surface of the groove portion is 2 or more and 5 or less, and
a mean free path of a deposited particle by a forming method of the protective film is shorter than a mean free path of a deposited particle by a forming method of the first inorganic insulating layer and the second inorganic insulating layer.

9. The method of manufacturing a display device according to claim 8, wherein
the side surface of the groove portion of the organic insulating layer is inclined at an angle of 70 degrees or more and 90 degrees or less to a bottom portion of the organic insulating layer.

10. The method of manufacturing a display device according to claim 8, wherein
the ratio between the height of the groove portion and a width of the bottom surface of the groove portion is 2.5 or more and 4 or less.

11. The method of manufacturing a display device according to claim 8, wherein
the protective film is formed by a sputtering method.

12. The method of manufacturing a display device according to claim 8, wherein
each of the first inorganic insulating layer and the second inorganic insulating layer are formed of a silicon nitride film.

13. The method of manufacturing a display device according to claim 12, wherein
the protective film has an etching selectivity ratio of 2 or more with respect to the second inorganic insulating layer.

14. The method of manufacturing a display device according to claim 13, wherein
the protective film is formed of a silicon oxide film.

* * * * *